(12) United States Patent
Gallatin et al.

(10) Patent No.: US 7,127,699 B2
(45) Date of Patent: Oct. 24, 2006

(54) METHOD FOR OPTIMIZING A NUMBER OF KERNELS USED IN A SUM OF COHERENT SOURCES FOR OPTICAL PROXIMITY CORRECTION IN AN OPTICAL MICROLITHOGRAPHY PROCESS

(75) Inventors: Gregg M. Gallatin, Newton, CT (US); Emanuel Gofman, Haifa (IL); Kafai Lai, Poughkeepsie, NY (US); Mark A. Lavin, Katonah, NY (US); Maharaj Mukherjee, Wappingers Falls, NY (US); Dov Ramm, Menashe (IL); Alan Edward Rosenbluth, Yorktown Heights, NY (US); Shlomo Shlafman, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 322 days.

(21) Appl. No.: 10/737,626

(22) Filed: Dec. 16, 2003

(65) Prior Publication Data

US 2005/0132310 A1 Jun. 16, 2005

(51) Int. Cl.
*G06F 17/50* (2006.01)
(52) U.S. Cl. .............................. 716/21; 716/19; 716/4; 716/2

(58) Field of Classification Search ................. 716/4–8, 716/19–21, 2; 703/2, 13; 382/141–151, 382/254–274; 250/67, 83, 204, 550–554
See application file for complete search history.

(56) References Cited

U.S. PATENT DOCUMENTS

| 4,081,858 | A  | * | 3/1978  | Koblasz et al. ............. 702/111 |
| 6,223,139 | B1 | * | 4/2001  | Wong et al. .................... 703/5 |
| 6,289,499 | B1 | * | 9/2001  | Rieger et al. ................. 716/21 |
| 6,665,856 | B1 | * | 12/2003 | Pierrat et al. ................. 716/19 |
| 6,677,601 | B1 | * | 1/2004  | Shiraishi ................ 250/559.29 |
| 6,738,859 | B1 | * | 5/2004  | Liebchen ..................... 716/19 |
| 6,921,916 | B1 | * | 7/2005  | Adel et al. .................... 257/48 |
| 2003/0140330 | A1 | * | 7/2003 | Tanaka et al. ................ 716/19 |

* cited by examiner

*Primary Examiner*—Vuthe Siek
*Assistant Examiner*—Nghia M. Doan
(74) *Attorney, Agent, or Firm*—F. Chau & Associates LLC

(57) ABSTRACT

A method is provided for optimizing the number of kernels N used in a sum of coherent sources (SOCS) for optical proximity correction in an optical microlithography process, including setting the number of kernels N to a predetermined minimum value Nmin, where a determination is made as to whether an accuracy estimate of calculated intensity is within a tolerable value, and a determination is also made as to whether an added X/Y asymmetry estimate of the calculated intensity is negligible.

12 Claims, 2 Drawing Sheets

METHOD FOR OPTIMIZING A NUMBER OF KERNELS USED IN A SUM OF COHERENT SOURCES FOR OPTICAL PROXIMITY CORRECTION IN AN OPTICAL MICROLITHOGRAPHY PROCESS

BACKGROUND OF THE INVENTION

1. Field of the Invention

The present disclosure relates to optical microlithography, and more particularly to mask design.

2. Description of the Related Art

Optical Proximity Correction (OPC) involves making systematic modifications to mask geometries in lithography to increase the achievable resolution and pattern transfer fidelity for IC manufacturing. This is accomplished by compensating mask geometry for known effects which will occur during imaging or subsequent processing.

The essential part of a proximity correction apparatus is a simulation engine that provides an accurate simulation of the on-wafer shape, given an input shape on the mask. Conventional simulation engines use the Sum of Coherent Systems (SOCS) method, in which on-wafer light intensity for partially coherent illumination is decomposed into an incoherent sum of intensities from a nominally infinite number of coherent systems. For each particular "coherent system", a design geometry with a corresponding kernel is computed, and the magnitude of the image intensity from the design geometry is an addend in the sum of coherent sources. To be practical, the SOCS method uses only a finite number of terms, N, where N is chosen to provide a required degree of accuracy. The number N represents the number of kernels.

Increasing N improves SOCS accuracy, but also increases computation time and run time memory requirements. Since integrated circuit masks may contain hundreds of millions of shapes which must be corrected, computation time is at a premium, so it is important to make an efficient choice of kernels. It can be shown that the most efficient set of coherent kernels is obtained by making a Mercer expansion of the bilinear imaging operator (for example, the Hopkins imaging model that is shown as equation 1 below), so that the kernels are the weighted eigenfunctions of the imaging operator. Other choices (for example, forming a separate coherent kernel from each small element of the illumination source) are known to be less efficient. This is shown, for example, in Y. C. Pati and T. Kailath, "Phase-shifting masks for microlithography: automated design and mask requirements," J. Opt. Soc. Am. A 11, no. 9 (1994): p. 2438.

In the current state-of-the-art proximity correction systems, the number of kernels N is chosen manually before starting the simulation process based on ad hoc recommendations of simulation tool providers. A small number of test cases is performed to determine if the recommended N provides the required accuracy. Another factor to consider in the determination of the proper N is the possible occurrence of an X/Y asymmetry artifact. X/Y asymmetry artifacts may cause the OPC process to apply different corrections to each instance of the same shape, depending on the shape orientation. This in turn may lead to different behavior of cells that are meant to be identical, which is highly undesirable.

Conventionally, to avoid asymmetry, N is increased until asymmetry is eliminated or negligible. However, such a manual approach is not reliable and can greatly increase turn-around time if the asymmetry is overlooked at the beginning of the process. The problem is especially acute in situations that deal with an optical model having variable parameters or with a multiplicity of different optical models.

Thus, there is a need for a process in which N is chosen automatically to optimize accuracy and prevent X/Y asymmetry artifacts.

SUMMARY OF THE INVENTION

Methods applied according to various exemplary embodiments of the present invention result in automatic optimization of the number of kernels N used in a SOCS simulation so that accuracy requirements are automatically satisfied and asymmetry is negligible.

A method for optimizing the number of kernels N used in a sum of coherent systems for optical proximity correction in an optical microlithography process according to an embodiment of the present invention includes setting the number of kernels N to a predetermined minimum value Nmin. A determination is made as to whether an accuracy estimate of calculated intensity is within a tolerable value. A determination is also made as to whether an added X/Y asymmetry estimate of the calculated intensity is negligible.

These and other features of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DESCRIPTION OF PREFERRED EMBODIMENTS

Figure 1:
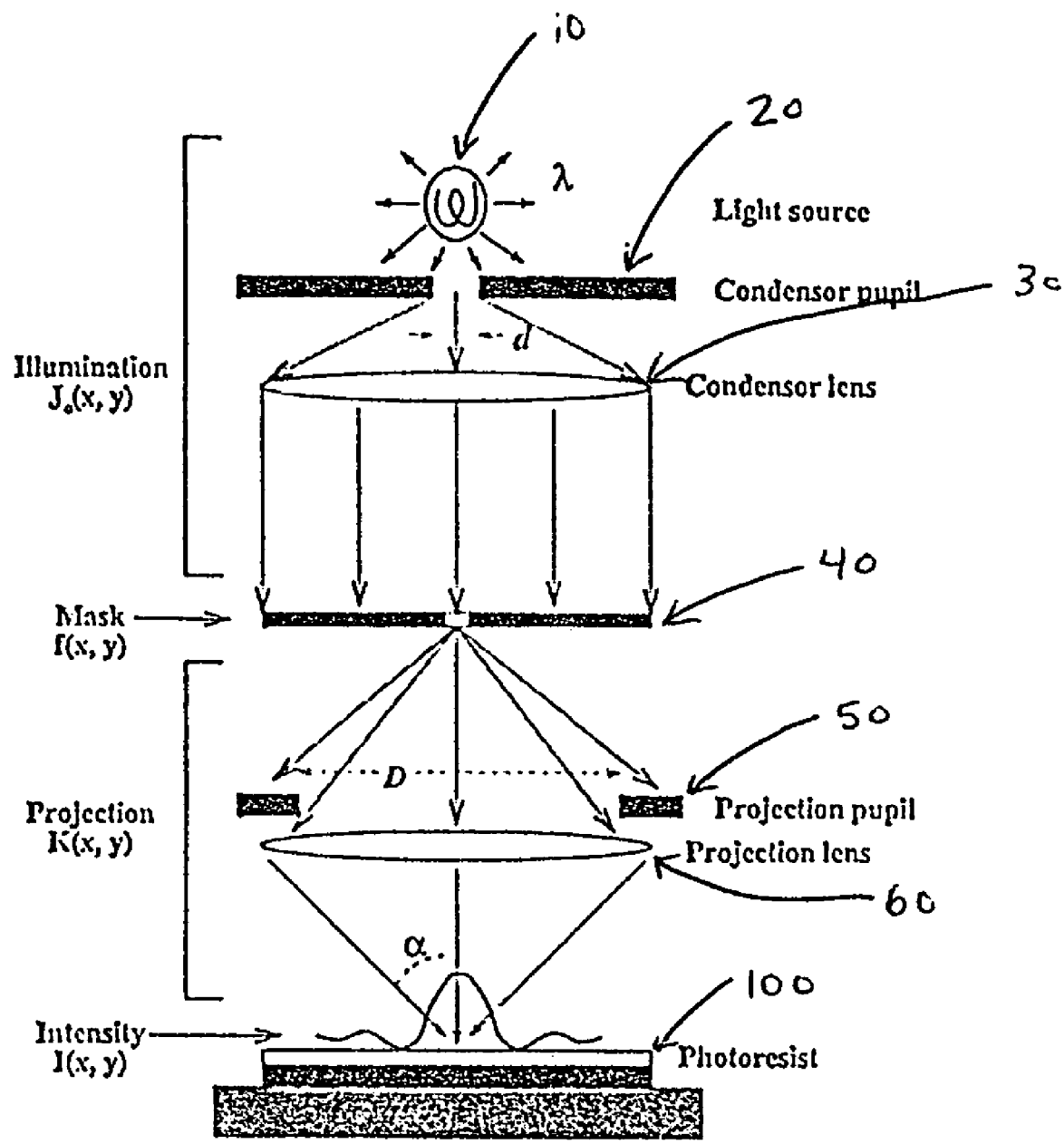
FIG. 1 is a schematic of a conventional projection system.

Current optical projection systems employed in optical lithography exclusively use partially coherent illumination. FIG. 1 is a schematic of a typical projection system. The projection system 1 includes a light source 10, a first condenser pupil 20, a first condenser lens 30, a mask 40, a second projection pupil 50, and a second projection lens 60. The projection system 1 in this case is used to form a pattern in a photoresist 100.

The process of partially coherent optical imaging may be described by the following nonlinear integral equation (the Hopkins model):

$$I(x, y) = [T(f)](x, y) \quad (1)$$

$$= \iiint\int f(\xi_1, \xi_2) J_0(\xi_1, \xi_2, \eta_1, \eta_2) f^*(\eta_1, \eta_2) \cdot K(x, y, \xi_1, \xi_2) K^*(x, y, \eta_1, \eta_2) d\xi_1 d\xi_2 d\eta_1 d\eta_2$$

where:
T( ) is the bilinear imaging operator;
I( ) is the intensity image at the image plane;
f( ) is the object being imaged (mask);
K( ) is the coherent point spread function—describing properties of the projection system; and $J_0(\ )$ is the mutual intensity function—describing coherence properties of the illumination.

The Hopkins partially coherent imaging equation (1) can be expanded in terms of eigenvalues and eigenfunctions via the Mercer expansion, as can other bilinear models of the imaging system, as long as the bilinear operator T exhibits Hermitian symmetry. That is, the image intensity in a partially coherent optical system may be well-approximated by a finite sum of coherent images, i.e., $$I(x, y) \approx \sum_{n=1}^{N} a_n |(f * \phi_n)(x, y)|^2 \qquad (2)$$

where $\alpha_n$ are the eigenvalues and $\phi_n$ are the corresponding eigenfunctions (kernels) determined from the illumination mutual intensity function $J_0$ and the coherent point spread function K, and where * represents convolution.

If all eigenvalues are different, which means that the multiplicity of each eigenvalue is equal to 1, then exactly one eigenfunction (kernel) would correspond to each distinct eigenvalue. The various exemplary embodiments of the present invention results from the inventors' discovery that X/Y asymmetry artifacts are related to the multiplicity of eigenvalues, i.e. to the number of eigenvalues with the same numerical value. For multiplicity 1 there is no X/Y asymmetry for any choice of the number of kernels. However, in axisymmetric optical systems eigenvalues always occur in pairs. Because eigenvalues are sorted with respect to their value, some consecutive eigenvalues are equal to one another, and eigenfunctions (kernels) which correspond to the equal eigenvalues are generally simple transformations of one another. For example, either member of a pair of equal kernels (considered as two-dimensional functions of X,Y) can typically be obtained by rotation of the other member of the pair, e.g. through rotation by 90 degrees. If one such kernel of a pair is included in the SOCS calculation, but its "twin" kernel is not, then an X/Y asymmetry artifact is created. If a pair of kernels have equal eigenvalues, then any linear combination of the pair (if normalized) would also serve as a suitable eigenfunction, with the orthogonal combination forming the other kernel in the corresponding alternative pair. Often the "default" choice that is made by the eigensolver will reflect a breaking of the eigenvalue degeneracy at a numerically negligible level by the X/Y boundaries of the integration domain. Since these boundaries are aligned with the typical "Manhattan" layout of circuit features (i.e. a layout where features have a horizontal or vertical orientation), a circuit feature in one orientation may have an appreciably larger convolution with one of the two eigenfunctions than with the other, whereas in the perpendicular orientation the same circuit feature will show an opposite difference in convolutions. If the upper limit N in the sum of squared convolutions in eq. 2 is chosen in such a way that one of these two kernels is excluded, a false asymmetry will therefore be predicted in the images of the circuit feature at different orientations. When OPC is carried out using such a nonoptimal number of convolution kernels, an asymmetric bias will thus be applied to different orientations of the feature, resulting in unequal dimensions in the fabricated circuit, and hence in degraded circuit performance.

The method according to various exemplary embodiments of the present invention results in discrete optimization of the number of kernels N. The number of kernels N is chosen so that accuracy requirements are satisfied and asymmetry is negligible.

Figure 2:
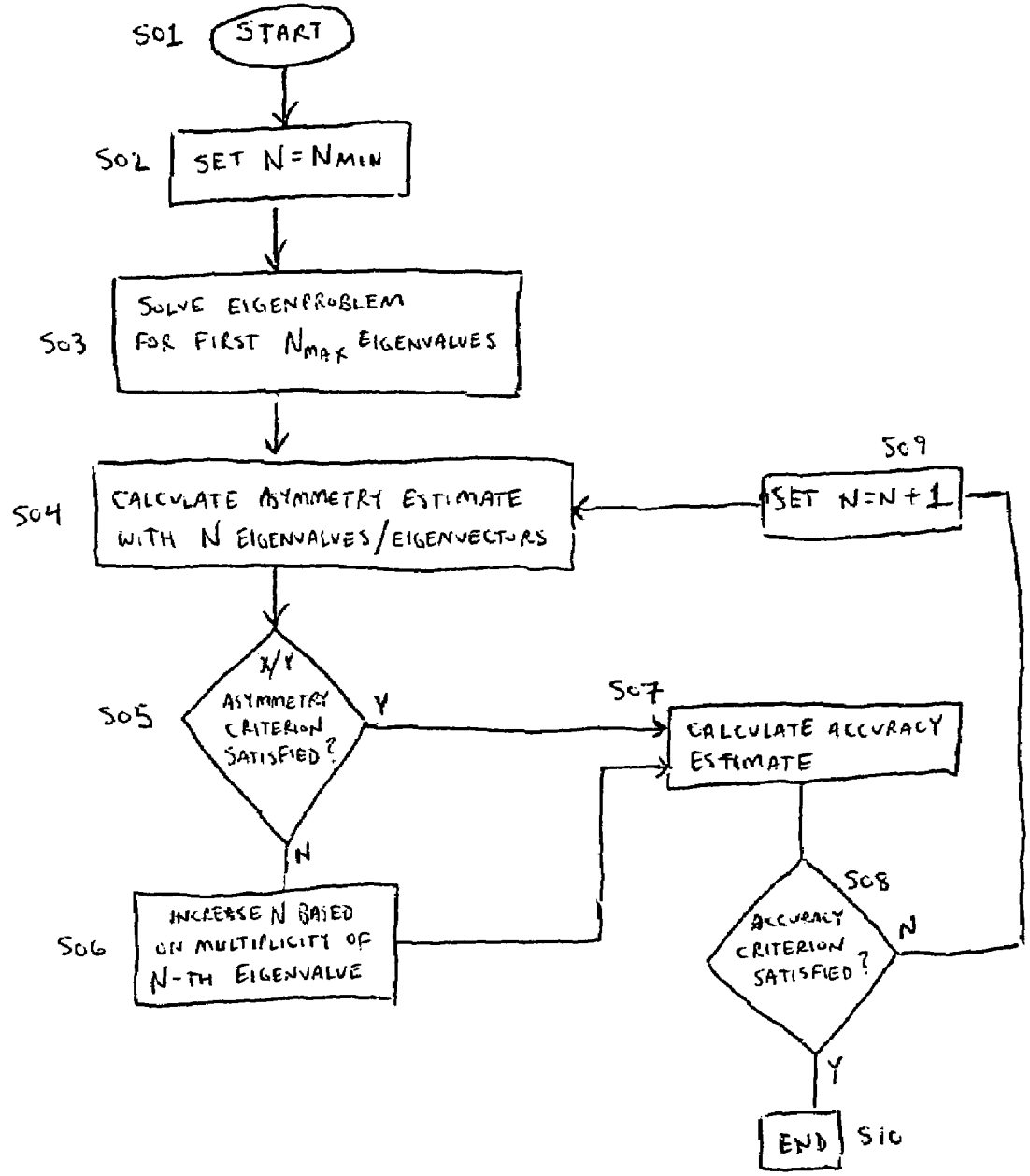
FIG. 2 is a flow diagram illustrating a method for optimizing the number of kernels used in a SOCS for optical proximity correction according to an exemplary embodiment of the invention.

FIG. 2 is a flow diagram illustrating a method for optimizing the number of kernels used in a SOCS process for optical proximity correction according to an embodiment of the invention. As shown in FIG. 2, the process starts at step s01 and continues to step s02, where N is set equal to Nmin. N takes on only integer values in a bounded range from Nmin to Nmax. The value for Nmin is preferably in the range of about 4 to 10.

The process continues to step S03, where the eigenproblem is solved for the first Nmax eigenvalues. In this step, the eigenvalues $\alpha_n$ and corresponding eigenfunctions $\phi_n$ are determined from the illumination mutual intensity function $J_0$ and the coherent point spread function K for the Nmax eigenvalues.

The process then continues to step S04, where the asymmetry estimate in the SOCS expansion is determined for the current value of N. Asymmetry is estimated by switching between X and Y in a truncated Mercer expansion of the Hopkins equation, such as equation (2) mentioned above, and comparing the X-Y results with the Y-X results in a certain norm, such as, for example, C or $L^2$. Simultaneously, the X/Y asymmetry of the original Hopkins equation (1) is computed by comparing Hopkins' kernel K(x,y) with K(y, x). This is done because there may be an inherent X/Y asymmetry, such as when certain Zernikes terms are present that define X/Y asymmetric abberations. In such a case, the inherent asymmetry is correctly accounted for to ensure that the finite number of kernels does not introduce terms that considerably modify the inherent asymmetry. Calculation of the added asymmetry is thus described by eq. 3:

$$\text{Added asymmetry} = \|\Delta\|, \text{ where} \qquad (3)$$

$$\Delta \equiv T(x_1, y_1; x_2, y_2) - T(y_1, x_1; y_2, x_2) -$$

$$\sum_{n=1}^{N} a_n \phi_n(x_1, y_1) \phi_n^*(x_2, y_2) + \sum_{n=1}^{N} a_n \phi_n(y_1, x_1) \phi_n^*(y_2, x_2)$$

Sometimes integrated circuits contain features oriented at 45 degrees and 135 degrees, in addition to the more common horizontal and vertical geometries. The asymmetry artifacts in such circuits are also prevented by the above test.

It should also be noted that T(x,y) is a bilinear operator, so that x,y is shorthand for a two-fold domain of planar integrations, and in eq. 3 x and y must be interchanged in both domains.

At step S05, it is determined whether the added X/Y asymmetry estimate is negligible for the value of N. In the present embodiment of the invention, the X/Y asymmetry estimate will be considered negligible if less than some predetermined value epsilon, where epsilon is very small, such as, for example, 0.1% of the maximum light intensity. (We may then apply a 0.001 limit on the magnitude of the eq. 3 added asymmetry, if T and the $\alpha_n$ are normalized in such a way that I(x,y) is 1 when f has a constant value of 1.)

If the X/Y asymmetry is excessive according to this criterion, the process proceeds to step s06, where N is increased. The increased value of N should be large enough to include all eigenvalues which have the same magnitude as the (N+1)st eigenvalue, starting with the (N+1)st. For example, if $a_{N+1} > a_{N+2}$, N is increased by only 1; otherwise N is increased until the new value of N satisfies $a_N > a_{N+1}$.

It may happen that in the first execution of step s05 (when N=Nmin), the asymmetry criterion is already satisfied, with no increase in N having been made. One still has the option in that case of increasing N by executing step s06 a single time.

If X/Y asymmetry is negligible in step s06, the process continues to step s07, where the overall accuracy of the Mercer expansion is assessed, according to:

$$\text{Accuracy} = \|\Delta'\|, \text{ where} \qquad (4)$$

$$\Delta' \equiv T(x_1, y_1; x_2, y_2) - \sum_{n=N+1}^{N\max} a_n \phi_n(x_1, y_1) \phi_n^*(x_2, y_2)$$

or alternatively, $$\text{Accuracy} = \|\Delta''\|, \text{ where} \qquad (5)$$

$$\Delta'' \equiv \sum_{n=N+1}^{N\max} |a_n|^2$$

A reasonable value for the accuracy $\Delta'$ is, for example, 1%, i.e. 10 times the tolerance on added asymmetry. If the accuracy estimate is not within the tolerable range, the process proceeds to step s09, where N is set equal to N+1. Otherwise, the process concludes at step s10. The resulting value for N is the smallest possible value that satisfies both constraints of accuracy and asymmetry.

According to an embodiment of the invention, when N passes the accuracy assessment of step s07, there is also an option to make a final pass through step s06. In such an embodiment, the procedure has the effect of ensuring that $a_N > a_{N+1}$ upon completion.

In another alternative embodiment of the invention, one may begin the determination of N by assuming a large value, for example $N=N_{max}$, and then reducing N to the point where further reductions would cause assessments s05 or s07 to fail.

According to various exemplary embodiments of the invention, optical proximity correction of a mask can be achieved by automatically optimizing a number of kernels N used in a sum of coherent systems (SOCS), based on accuracy and symmetry. Shapes formed on a wafer by the mask are simulated using the optimized value for N. The simulated shapes are compared with desired shapes, and the mask is corrected based on the comparison between the simulated shapes and the desired shapes.

Although the illustrative embodiments have been described herein with reference to the accompanying drawings, it is to be understood that the present invention and method are not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method for optimizing a number of kernels N used in a sum of coherent systems (SOCS) for optical proximity correction in an optical microlithography process, comprising:

setting the number of kernels N to a value at least as large as a predetermined minimum value Nmin;

determining an added X/Y asymmetry estimate of calculated intensity by switching between X and Y using the number of kernels N, comparing the X-Y results with Y-X results in a certain norm, and computing the X/Y asymmetry;

determining whether the added X/Y asymmetry estimate of calculated intensity is within a first tolerable value; and determining whether an accuracy estimate of the calculated intensity is within a second tolerable value.

2. The method of claim 1, wherein the value for the predetermined minimum value Nmin is in a range of about 4 to 10.

3. The method of claim 1, wherein the second tolerable value of the accuracy estimate corresponds to a limit of substantially 1% of a maximum light intensity.

4. The method of claim 1, wherein the step of determining an added X/Y asymmetry estimate comprises:

switching between X and Y in a truncated Mercer expansion of a Hopkins equation using the predetermined value for N;

comparing the X-Y results with the Y-X results of the truncated Mercer expansion in a certain norm; and computing the X/Y asymmetry of the Hopkins equation.

5. A method for optical proximity correction of a mask used in an optical microlithography process, comprising:

automatically optimizing a number of kernels N used in a sum of coherent sources (SOCS) based on accuracy and asymmetry;

simulating shapes formed by the mask using the optimized value for N;

comparing the simulated shapes with desired shapes; and correcting the mask based on the comparison between the simulated shapes and the desired shapes.

wherein the step of automatically optimizing the number of kernels N comprises:

setting the number of kernels N to a value at least as large as a predetermined minimum value Nmin;

determining an added X/Y asymmetry estimate of calculated intensity by switching between X and Y using the number of kernels N, comparing the X-Y results with Y-X results in a certain norm, and computing the X/Y asymmetry;

determining whether the added X/Y asymmetry estimate of calculated intensity is within a first tolerable value; and determining whether an accuracy estimate of the calculated intensity is within a second tolerable value.

6. The method of claim 5, wherein the value for the predetermined minimum value Nmin is in a range of about 4 to about 10.

7. The method of claim 5, wherein the second tolerable value of the accuracy estimate corresponds to a limit of substantially 1% of a maximum light intensity.

8. The method of claim 5, wherein the step of determining an added X/Y asymmetry estimate comprises:

switching between X and Y in a truncated Mercer expansion of a Hopkins equation using the predetermined value for N;

comparing the X-Y results with the Y-X results of the truncated Mercer expansion in a certain norm; and computing the X/Y asymmetry of the Hopkins equation.

9. A method for optimizing a number of kernels N used in a sum of coherent systems (SOCS) for optical proximity correction in an optical microlithography process, comprising:

setting the number of kernels N to a value at least as large as a predetermined minimum value Nmin;

determining an added X/Y asymmetry estimate of calculated intensity by switching between X and Y using the number of kernels N, comparing the X-Y results with Y-X results in a certain norm, and computing the X/Y asymmetry;

determining whether the added X/Y asymmetry estimate of calculated intensity is within a first tolerable value;

increasing the value of N if the added X/Y asymmetry estimate of calculated intensity is not within the first tolerable value, where a $1^{st}$ through (N+1)th SOCS eigenvalue correspond to the $1^{st}$ through (N+1)th kernel, respectively, and determining whether the Nth SOCS eigenvalue is larger than the (N+1)th eigenvalue; and determining whether an accuracy estimate of the calculated intensity is within a second tolerable value.

10. The method of claim 9, wherein the value for the predetermined minimum value Nmin is in a range of about 4 to about 10.

11. The method of claim 9, wherein the second tolerable value of the accuracy estimate corresponds to a limit of substantially 1% of a maximum light intensity.

12. The method of claim 9, wherein the step of determining an added X/Y asymmetry estimate comprises:

switching between X and Y in a truncated Mercer expansion of a Hopkins equation using the predetermined value for N;

comparing the X-Y results with the Y-X results of the truncated Mercer expansion in a certain norm; and computing the X/Y asymmetry of the Hopkins equation.

* * * * *